(12) United States Patent
Morioka et al.

(10) Patent No.: US 8,546,178 B2
(45) Date of Patent: Oct. 1, 2013

(54) SEMICONDUCTOR LIGHT EMITTING DEVICE AND METHOD FOR MANUFACTURING SEMICONDUCTOR LIGHT EMITTING DEVICE

(75) Inventors: Tomoko Morioka, Kanagawa-ken (JP); Takayoshi Fujii, Kanagawa-ken (JP); Toshitake Kitagawa, Kanagawa-ken (JP); Kazufumi Shiozawa, Kanagawa-ken (JP); Taisuke Sato, Kanagawa-ken (JP); Hidefumi Yasuda, Kanagawa-ken (JP); Yuko Kato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 13/180,889

(22) Filed: Jul. 12, 2011

(65) Prior Publication Data
US 2012/0012874 A1    Jan. 19, 2012

(30) Foreign Application Priority Data
Jul. 13, 2010  (JP) .................................. 2010-158506

(51) Int. Cl.
*H01L 33/00*          (2010.01)
(52) U.S. Cl.
USPC ........... 438/96; 257/98; 257/E33.04; 438/481
(58) Field of Classification Search
None
See application file for complete search history.

(56) References Cited

U.S. PATENT DOCUMENTS

2005/0179130 A1*  8/2005  Tanaka et al. ................. 257/730
2006/0091376 A1   5/2006  Kim et al.

FOREIGN PATENT DOCUMENTS

JP  2003-318441  11/2003
JP  2006-135285   5/2006

OTHER PUBLICATIONS

Notification of Reason(s) for Refusal issued Aug. 30, 2012 in Japanese Patent Application No. 2010-158506 (with English translation).

* cited by examiner

*Primary Examiner* — William D Coleman
*Assistant Examiner* — Su Kim
(74) *Attorney, Agent, or Firm* — Oblon, Spivak, McClelland, Maier & Neustadt, L.L.P.

(57) ABSTRACT

According to one embodiment, a semiconductor light emitting device includes a substrate, a first semiconductor layer, a light emitting layer, a second semiconductor layer, and a translucent electrode. The substrate includes a first region provided along periphery of a first major surface and a second region provided on center side of the first major surface as viewed from the first region. The first semiconductor layer is provided on the first major surface of the substrate. The light emitting layer is provided on the first semiconductor layer. The second semiconductor layer is provided on the light emitting layer. The translucent electrode is provided on the second semiconductor layer. A reflectance in the second region is higher than a reflectance in the first region.

13 Claims, 8 Drawing Sheets ered outside
SEMICONDUCTOR LIGHT EMITTING DEVICE AND METHOD FOR MANUFACTURING SEMICONDUCTOR LIGHT EMITTING DEVICE

CROSS-REFERENCE TO RELATED APPLICATIONS

This application is based upon and claims the benefit of priority from the prior Japanese Patent Application No. 2010-158506, filed on Jul. 13, 2010; the entire contents of which are incorporated herein by reference.

FIELD

Embodiments described herein relate generally to a semiconductor light emitting device and a method for manufacturing the semiconductor light emitting device.

BACKGROUND

There is known a semiconductor light emitting device in which an n-type semiconductor layer, a light emitting layer, a p-type semiconductor layer, and a translucent electrode are stacked on a substrate. The translucent electrode and the n-type semiconductor layer are provided with respective electrodes. In such a semiconductor light emitting device, light generated in the light emitting layer is extracted outside through the translucent electrode or the substrate. However, the problem is that the light extraction efficiency decreases due to attenuation of light.

DETAILED DESCRIPTION

Figure 1:
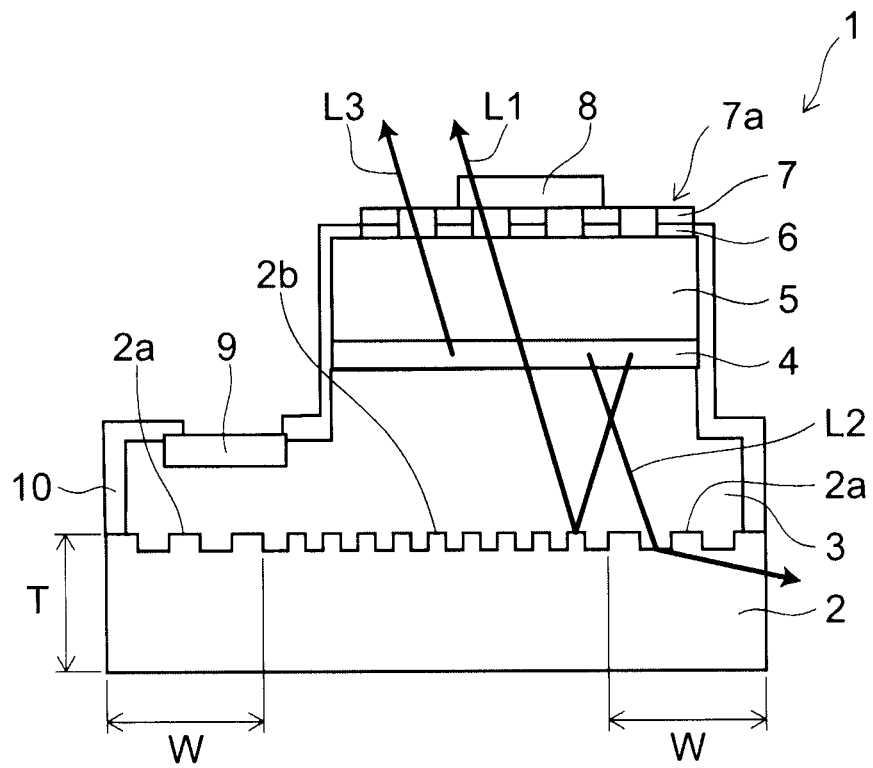
FIG. 1 is a schematic sectional view illustrating a semiconductor light emitting device according to an embodiment.

In general, according to one embodiment, a semiconductor light emitting device includes a substrate, a first semiconductor layer, a light emitting layer, a second semiconductor layer, and a translucent electrode. The substrate includes a first region provided along periphery of a first major surface and a second region provided on center side of the first major surface as viewed from the first region. The first semiconductor layer is provided on the first major surface of the substrate. The light emitting layer is provided on the first semiconductor layer. The second semiconductor layer is provided on the light emitting layer. The translucent electrode is provided on the second semiconductor layer. A reflectance in the second region is higher than a reflectance in the first region.

In general, according to another embodiment, a semiconductor light emitting device includes a substrate, a first semiconductor layer, a light emitting layer, a second semiconductor layer, and a translucent electrode. The substrate includes a first region provided along periphery of a first major surface and a second region provided on center side of the first major surface as viewed from the first region. The first semiconductor layer is provided on the first major surface of the substrate. The light emitting layer is provided on the first semiconductor layer. The second semiconductor layer is provided on the light emitting layer. The translucent electrode is provided on the second semiconductor layer. A transmittance in the first region is higher than a transmittance in the second region.

In general, according to another embodiment, a method is disclosed for manufacturing a semiconductor light emitting device. The method can include forming, at a first major surface of a substrate, a first region along periphery of the first major surface and a second region on center side of the first major surface as viewed from the first region. The second region has a higher reflectance than the first region. The method can include forming a first semiconductor layer on the first major surface of the substrate. The method can include forming a light emitting layer on the first semiconductor layer. In addition, the method can include forming a second semiconductor layer on the light emitting layer.

In general, according to another embodiment, a method is disclosed for manufacturing a semiconductor light emitting device. The method can include forming, at a first major surface of a substrate, a first region along periphery of the first major surface and a second region on center side of the first major surface as viewed from the first region. The second region has a lower transmittance than the first region. The method can include forming a first semiconductor layer on the first major surface of the substrate. The method can include forming a light emitting layer on the first semiconductor layer. In addition, the method can include forming a second semiconductor layer on the light emitting layer.

Various embodiments will be described hereinafter with reference to the accompanying drawings. In the drawings, similar components are labeled with like reference numerals, and the detailed description thereof is omitted as appropriate.

FIG. 1 is a schematic sectional view illustrating a semiconductor light emitting device according to an embodiment.

As shown in FIG. 1, the semiconductor light emitting device 1 includes a substrate 2, a semiconductor layer 3 (first semiconductor layer), a light emitting layer 4, a semiconductor layer 5 (second semiconductor layer), a light transmitting layer 6, a translucent electrode 7, an electrode 8, an electrode 9, and an insulating layer 10.

The substrate 2 includes a peripheral region (first region) provided along the periphery of a major surface (first major surface) on the semiconductor layer 3 side, and a central region (second region) provided on the center side of the major surface as viewed from the peripheral region.

Furthermore, protrusions 2a are formed in the peripheral region, and protrusions 2b are formed in the central region. The protrusions 2a and protrusions 2b will be described later in detail.

On the major surface of the substrate 2 on the side of the protrusions 2a and protrusions 2b, the semiconductor layer is formed by crystal growth. Crystal growth of the semiconductor layer 3 is preferably performed by using a substrate made of the same material as the semiconductor layer 3, or using a substrate made of a material close to that of the semiconductor layer 3 in lattice constant and thermal expansion coefficient. For instance, in the case where the semiconductor layer 3 is made of nitride semiconductor, the substrate 2 is preferably made of nitride semiconductor. However, in general, it is difficult to form a substrate made of nitride semiconductor in an appropriate size. Hence, as a substitute for a substrate made of nitride semiconductor, a sapphire substrate, an SiC substrate, and a spinel substrate can be used.

The semiconductor layer 3 can be made of a semiconductor doped into n-type (n-type semiconductor). In this case, the semiconductor layer 3 can be made of an n-type nitride semiconductor. Examples of the nitride semiconductor can include GaN (gallium nitride), AlN (aluminum nitride), AlGaN (aluminum gallium nitride), and InGaN (indium gallium nitride).

The light emitting layer 4 is provided on the opposite side of the semiconductor layer 3 to the substrate 2 side.

The light emitting layer 4 can be configured as a quantum well structure composed of a well layer and a barrier layer (cladding layer). In the well layer, holes and electrons are recombined to generate light. The barrier layer has a larger band gap than the well layer.

In this case, the quantum well structure may be a single quantum well (SQW) structure or a multiple quantum well (MQW) structure. Alternatively, a plurality of single quantum well structures may be stacked.

For instance, as an example of the single quantum well structure, a barrier layer made of GaN (gallium nitride), a well layer made of InGaN (indium gallium nitride), and a barrier layer made of GaN (gallium nitride) can be stacked in this order.

As an example of the multiple quantum well structure, a barrier layer made of GaN (gallium nitride), a well layer made of InGaN (indium gallium nitride), a barrier layer made of GaN (gallium nitride), a well layer made of InGaN (indium gallium nitride), and a barrier layer made of GaN (gallium nitride) can be stacked in this order.

In this case, the aforementioned semiconductor layer 3 can be used as a barrier layer.

The light emitting layer 4 is not limited to quantum well structures, but can be suitably selected from structures capable of emitting light.

The semiconductor layer 5 is provided on the opposite side of the light emitting layer 4 to the semiconductor layer 3 side.

The semiconductor layer 5 can be made of a semiconductor doped into p-type (p-type semiconductor). In this case, the semiconductor layer 5 can be made of a p-type nitride semiconductor. Examples of the nitride semiconductor can include GaN (gallium nitride), AlN (aluminum nitride), AlGaN (aluminum gallium nitride), and InGaN (indium gallium nitride).

In the case where the transmitting portion 7a, described later, of the translucent electrode 7 is penetrated, the light transmitting layer 6 is provided over the surface of the semiconductor layer 5 exposed to the transmitting portion 7a.

The light transmitting layer 6 transmits incident light. For instance, the light transmitting layer 6 transmits light emitted from the light emitting layer 4 and injected into the light transmitting layer 6, and light reflected by e.g. the substrate 2 and injected into the light transmitting layer 6. To this end, the light transmitting layer 6 is formed from a light transmissive material.

Furthermore, the light transmitting layer 6 insulates the surface of the semiconductor layer 5 exposed to the transmitting portion 7a.

The light transmitting layer 6 can be formed from e.g. $SiO_2$ (silicon dioxide).

However, the light transmitting layer 6 is not necessarily needed, but can be provided as necessary. For instance, if the transmitting portion 7a is not penetrated, or if there is no need to insulate the surface of the semiconductor layer 5 exposed to the transmitting portion 7a, then the light transmitting layer 6 can be omitted.

The translucent electrode 7 is provided on the opposite side of the semiconductor layer 5 to the light emitting layer 4 side. Here, in the case where the semiconductor layer 5 is made of p-type GaN (gallium nitride), the electron mobility is low. Hence, the electrode 8 alone may be insufficient to allow the current from the electrode 8 to spread throughout the semiconductor layer 5. Thus, the translucent electrode 7 is provided to spread the current from the electrode 8 throughout the semiconductor layer 5.

Furthermore, the translucent electrode 7 also needs to transmit incident light. For instance, the translucent electrode 7 also needs to transmit light emitted from the light emitting layer 4 and injected into the translucent electrode 7, and light reflected by e.g. the substrate 2 and injected into the translucent electrode 7. To this end, the translucent electrode 7 is formed from a light transmissive material.

In this case, the translucent electrode 7 can be made of e.g. ITO (indium tin oxide).

The translucent electrode 7 includes a transmitting portion 7a.

The transmitting portion 7a is provided to reduce absorption of light in the translucent electrode 7 to increase the light extraction efficiency. The transmitting portion 7a will be described later in detail.

Furthermore, projections and depressions can also be provided at the major surface of the translucent electrode 7 on the semiconductor layer 5 side to form a refractive index distribution. By the refractive index distribution thus formed, light confined in the semiconductor light emitting device 1 can be extracted outside by the diffraction effect. This can further increase the light extraction efficiency.

The electrode 8 is formed on the translucent electrode 7. For instance, the electrode 8 can be made of a metal material such as a double layer of Ni (nickel)/Au (gold).

The electrode 9 is formed on the semiconductor layer 3. For instance, the electrode 9 can be made of a metal material such as a double layer of Al (aluminum)/Ti (titanium).

The insulating layer 10 is formed over the exposed portion of the semiconductor layer 3, the light emitting layer 4, and the semiconductor layer 5. For instance, the insulating layer 10 can be made of an insulative material such as $SiO_2$ (silicon dioxide).

Next, the protrusions 2a and protrusions 2b formed on the major surface of the substrate 2 on the semiconductor layer 3 side are further illustrated.

Figure 2:
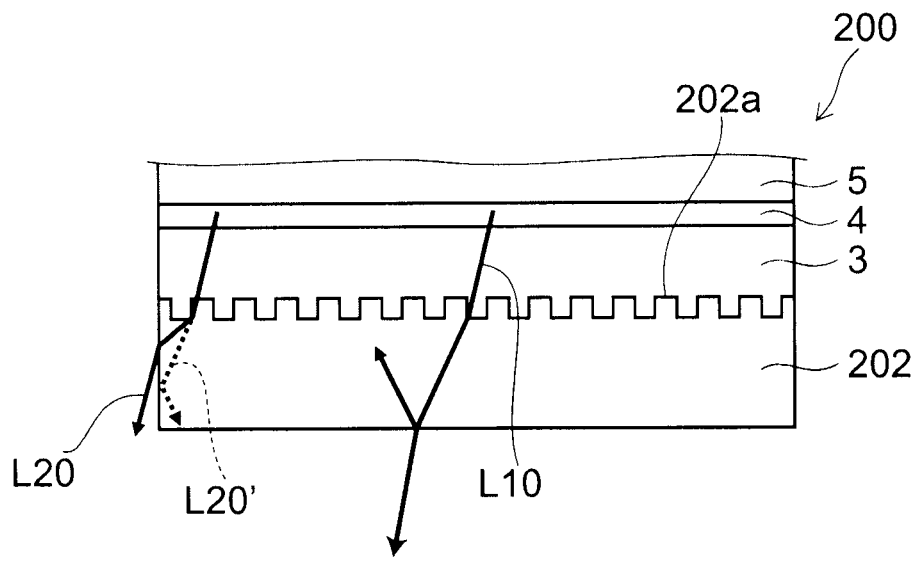
FIG. 2 is a schematic sectional view illustrating the main part of a semiconductor light emitting device according to a comparative example.

FIG. 2 is a schematic sectional view illustrating the main part of a semiconductor light emitting device according to a comparative example. More specifically, FIG. 2 is a schematic sectional view illustrating the case where protrusions 202a are provided at an equal pitch dimension at the major surface of the substrate 202 on the semiconductor layer 3 side.

As shown in FIG. 2, the semiconductor light emitting device 200 includes a substrate 202, a semiconductor layer 3, a light emitting layer 4, and a semiconductor layer 5. Protrusions 202a are provided at an equal pitch dimension at the major surface of the substrate 202 on the semiconductor layer 3 side.

Thus, in the case where protrusions 202a are provided at an equal pitch dimension at the major surface of the substrate 202 on the semiconductor layer 3 side, light L10, L20 emitted from the light emitting layer 4 and being incident on the interface of the semiconductor layer 3 and the substrate 202 is scattered or diffracted by the protrusions 202a. Hence, part of the incident light is injected into the substrate 202.

In this case, the light L10 injected in the central region of the substrate 202 is incident on the major surface of the substrate 202 opposite to the semiconductor layer 3 side. Thus, part of the incident light is reflected by the major surface of the substrate 202 opposite to the semiconductor layer 3 side, and the rest is emitted outward from the substrate 202. Here, the reflected light propagates by reflection in the substrate 202 and is emitted outward from the end portion of the substrate 202. This increases the amount of attenuation of light and decreases the light extraction efficiency.

On the other hand, if the diffraction angle of light injected in the peripheral region of the substrate 202 is small, the light is totally reflected at the end portion of the substrate 202. This makes it difficult to extract the light L20' to the outside. In this case, as indicated by L20 in FIG. 2, if the diffraction angle of light injected into the substrate 202 is made larger, total reflection at the end portion of the substrate 202 can be suppressed. Thus, if the diffraction angle of light injected in the peripheral region of the substrate 202 is made larger, light can be efficiently emitted outward from the end portion of the substrate 202. This can reduce the amount of attenuation of light and increase the light extraction efficiency.

As described above, in the central region of the substrate 202, it is preferable to suppress injection of light into the substrate 202 and facilitate reflection of light. That is, in the central region of the substrate 202, it is preferable that the reflectance of light be higher (the transmittance of light be lower). In the peripheral region of the substrate 202, it is preferable to suppress reflection of light and facilitate emission of light from the end portion of the substrate 202. That is, in the peripheral region of the substrate 202, it is preferable that the transmittance of light be higher (the reflectance of light be lower). In this case, it is preferable that the diffraction angle of light injected in the peripheral region of the substrate 202 be made larger.

Here, according to the findings obtained by the inventors, the transmittance or reflectance of light can be changed by changing e.g. the pitch dimension, height dimension, and protrusion side surface angle of the protrusion.

Figure 3A:
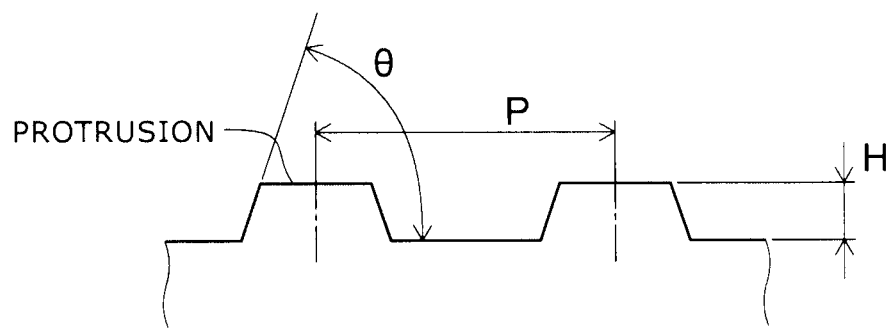
FIG. 3A is a schematic view for illustrating the pitch dimension P, height dimension H, and protrusion side surface angle θ of the protrusion.
Figure 3B:
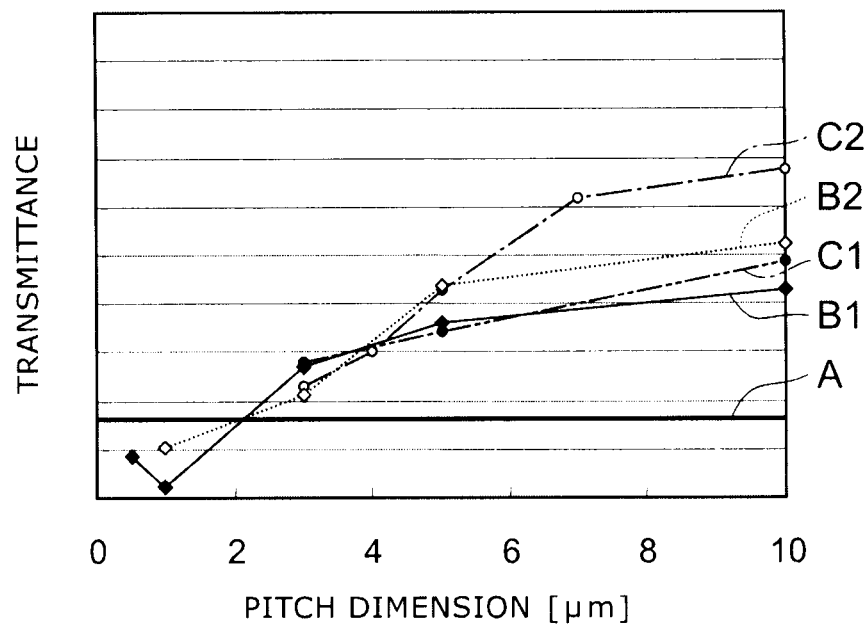
FIG. 3B is a schematic graph for illustrating the relation of the pitch dimension P, height dimension H, and protrusion side surface angle θ of the protrusion to the transmittance of light.

FIG. 3A is a schematic view for illustrating the pitch dimension P, height dimension H, and protrusion side surface angle θ of the protrusion. FIG. 3B is a schematic graph for illustrating the relation of the pitch dimension P, height dimension H, and protrusion side surface angle θ of the protrusion to the transmittance of light. In FIG. 3B, line A represents the case with no protrusion. Line B1 represents the case where the height dimension H of the protrusion is 0.5 μm and the angle θ of the protrusion side surface is 80°. Line B2 represents the case where the height dimension H of the protrusion is 1 μm and the angle θ of the protrusion side surface is 80°. Line C1 represents the case where the height dimension H of the protrusion is 0.5 μm and the angle θ of the protrusion side surface is 60°. Line C2 represents the case where the height dimension H of the protrusion is 1 μm and the angle θ of the protrusion side surface is 60°.

As seen from FIG. 3B, if the pitch dimension P of the protrusion is made smaller, the transmittance of light can be made lower. This also means that if the pitch dimension P of the protrusion is made smaller, the reflectance of light can be made higher.

Furthermore, if the height dimension H is made smaller, the transmittance of light can be made lower. This also means that if the height dimension H is made smaller, the reflectance of light can be made higher. This is made more prominent with the increase of the pitch dimension P of the protrusion.

Furthermore, if the angle θ of the protrusion side surface is made larger, the transmittance of light can be made lower. This also means that if the angle θ of the protrusion side surface is made larger, the reflectance of light can be made higher. This is made more prominent with the increase of the pitch dimension P of the protrusion.

Thus, in the embodiment, the reflectance in the central region is made higher than the reflectance in the peripheral region. For instance, the reflectance in the central region is made higher than the reflectance in the peripheral region by changing at least one selected from the group consisting of the pitch dimension P, height dimension H, and protrusion side surface angle θ of the protrusions 2a, 2b.

Furthermore, the transmittance in the peripheral region is made higher than the transmittance in the central region. For instance, the transmittance in the peripheral region is made higher than the transmittance in the central region by changing at least one selected from the group consisting of the pitch dimension P, height dimension H, and protrusion side surface angle θ of the protrusions 2a, 2b.

That is, an appropriate transmittance or reflectance of light is provided to each region of the substrate by changing at least one of the pitch dimension P, height dimension H, and protrusion side surface angle θ of the protrusion for each region of the substrate.

Figure 4:
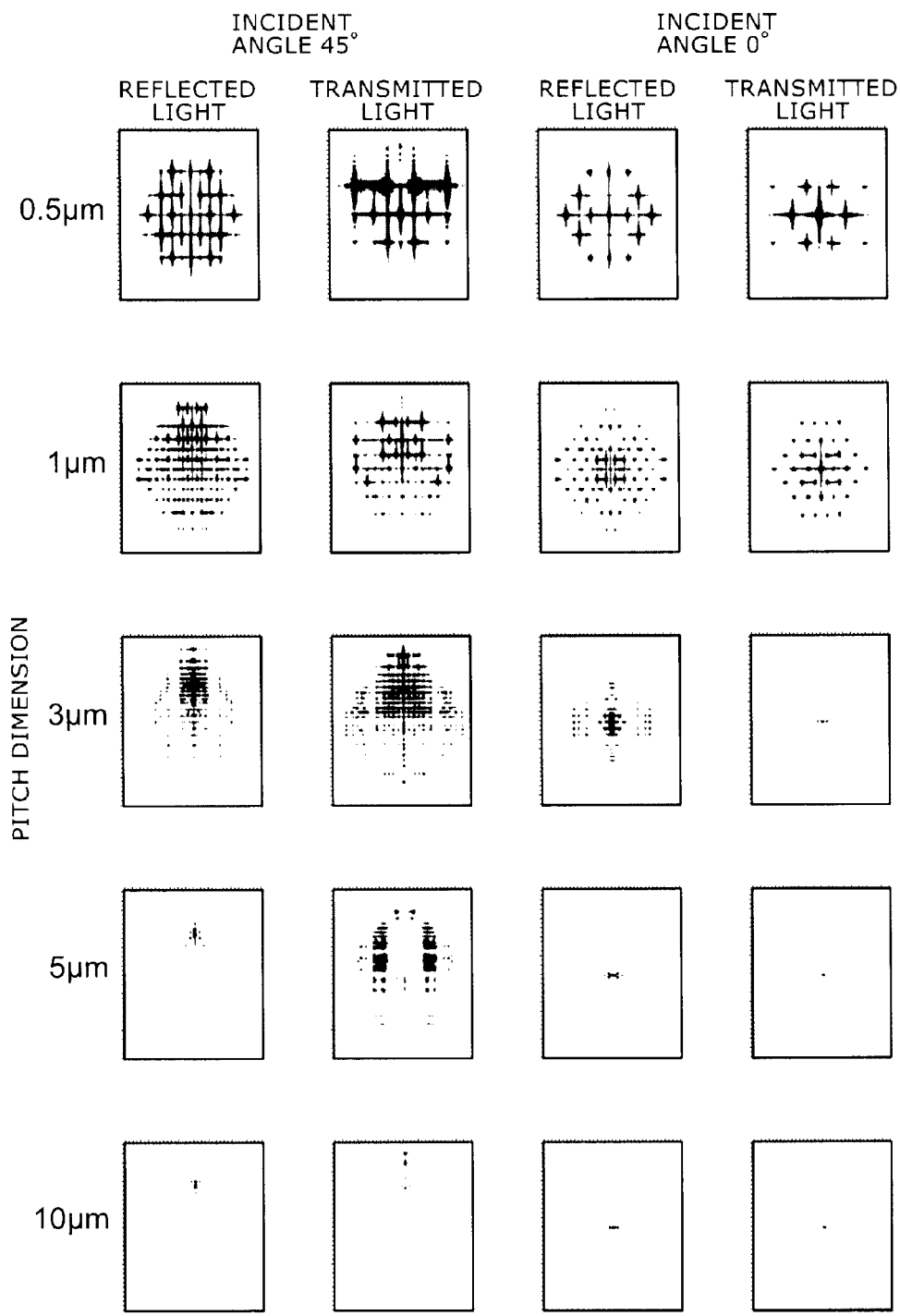
FIG. 4 is a schematic graph for illustrating the distribution of transmitted light and reflected light with respect to the pitch dimension of the protrusion.

FIG. 4 is a schematic graph for illustrating the distribution of transmitted light and reflected light with respect to the pitch dimension of the protrusion. In the figure, the portion with dark shade represents a portion with high light intensity. In this case, the height dimension H of the protrusion is 0.5 μm, and the angle θ of the protrusion side surface is 80°. The incident angle in the figure refers to the angle with respect to the axis perpendicular to the incident surface. An incident angle of 0° corresponds to the case where light is incident from the direction perpendicular to the incident surface. An incident angle of 45° corresponds to the case where light is incident from a direction of 45° with respect to the axis perpendicular to the incident surface.

As seen from FIG. 4, if the pitch dimension P of the protrusion is made smaller, the distribution range of transmitted light and the distribution range of reflected light can be expanded. It is considered that this is because more components are bent by diffraction if the pitch dimension P of the protrusion is made smaller.

On the other hand, if the pitch dimension P of the protrusion is made larger, the distribution range of transmitted light and the distribution range of reflected light can be narrowed. It is considered that this is because fewer components are bent by diffraction and more components contribute to the zeroth order light if the pitch dimension P of the protrusion is made larger.

Figure 5:
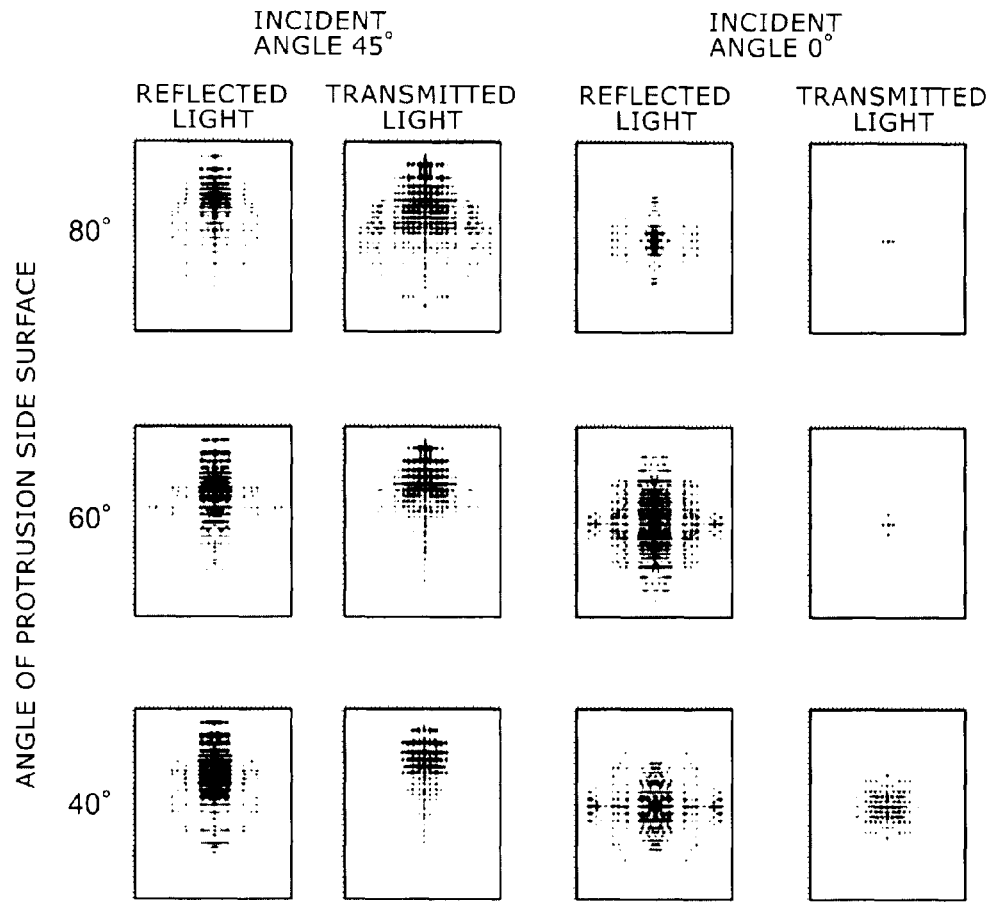
FIG. 5 is a schematic graph for illustrating the distribution of transmitted light and reflected light with respect to the angle of the protrusion side surface.

FIG. 5 is a schematic graph for illustrating the distribution of transmitted light and reflected light with respect to the angle of the protrusion side surface. In the figure, the portion with dark shade represents a portion with high light intensity. In this case, the height dimension H of the protrusion is 0.5 µm, and the pitch dimension P of the protrusion is 3 µm. The incident angle in the figure refers to the angle with respect to the axis perpendicular to the incident surface. An incident angle of 0° corresponds to the case where light is incident from the direction perpendicular to the incident surface. An incident angle of 45° corresponds to the case where light is incident from a direction of 45° with respect to the axis perpendicular to the incident surface.

As seen from FIG. 5, if the angle A of the protrusion side surface is made smaller, the distribution range of transmitted light and the distribution range of reflected light can be expanded also for an incident angle of 0°. It is considered that this is because more components are bent by diffraction and constitute higher order diffracted light with higher probability if the angle θ of the protrusion side surface is made smaller.

Figure 6:
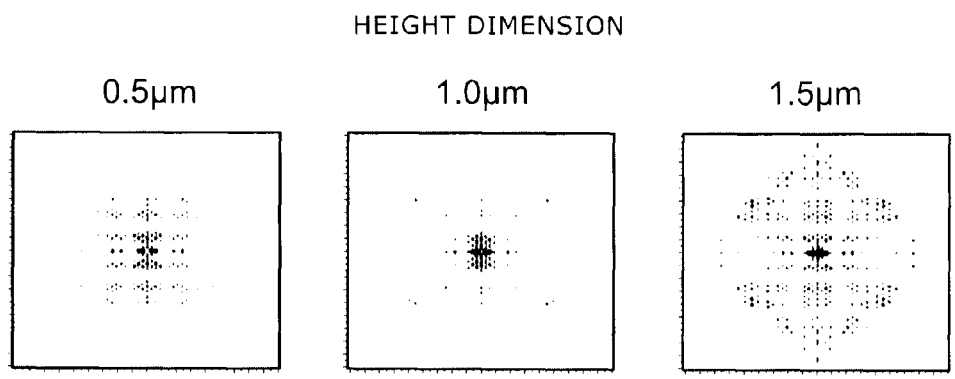
FIG. 6 is a schematic graph for illustrating the distribution of transmitted light with respect to the height dimension of the protrusion.

FIG. 6 is a schematic graph for illustrating the distribution of transmitted light with respect to the height dimension of the protrusion. In the figure, the portion with dark shade represents a portion with high light intensity. In this case, the pitch dimension P of the protrusion is 5 µm, the angle θ of the protrusion side surface is 60°, and the incident angle is 0°.

As seen from FIG. 6, if the height dimension of the protrusion is made higher, the distribution range of transmitted light can be expanded. It is considered that this is because more components are bent by diffraction and constitute higher order diffracted light with higher probability if the height dimension of the protrusion is made higher.

Here, by way of example, the case of changing the pitch dimension P of the protrusion depending on the region of the substrate is illustrated.

Figure 7A:
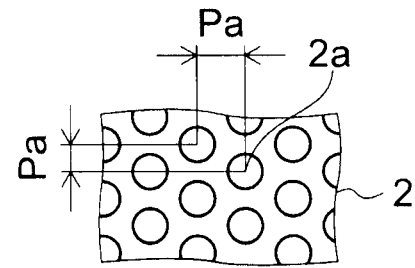
FIG. 7A is a schematic plan view illustrating the peripheral region of the substrate in FIG. 1.
Figure 7B:
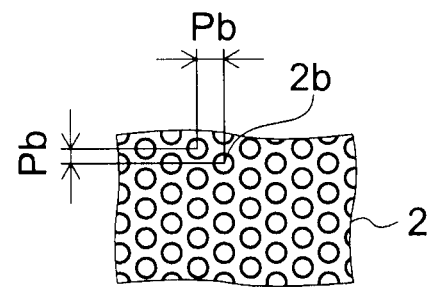
FIG. 7B is a schematic plan view illustrating the central region of the substrate in FIG. 1.

FIGS. 7A and 7B are schematic plan views for illustrating the case of changing the pitch dimension P of the protrusion depending on the region of the substrate. More specifically, FIG. 7A is a schematic plan view illustrating the peripheral region of the substrate 2 in FIG. 1. FIG. 7B is a schematic plan view illustrating the central region of the substrate 2 in FIG. 1.

As shown in FIGS. 7A and 7B, in the semiconductor light emitting device 1 according to the embodiment, the pitch dimension Pb of the protrusion 2b in the central region of the substrate 2 is made smaller than the pitch dimension Pa of the protrusion 2a in the peripheral region of the substrate 2. Thus, in the central region of the substrate 2, the reflectance of light can be made higher (the transmittance of light can be made lower).

In this case, as seen from FIG. 3B, if the pitch dimension Pa of the protrusion 2a in the peripheral region of the substrate 2 exceeds 2 µm, the transmittance of light can be made high, and hence light can be efficiently extracted from the peripheral side of the substrate 2. In this case, if the pitch dimension Pa of the protrusion 2a in the peripheral region of the substrate 2 exceeds 6 µm, the diffraction effect of light may be degraded (the diffraction angle of light may be made small).

Thus, the pitch dimension Pa of the protrusion 2a in the peripheral region of the substrate 2 can be set to exceed 2 µm and to be 6 µm or less.

Furthermore, if the pitch dimension Pb of the protrusion 2b in the central region of the substrate 2 is 2 µm or less, the reflectance of light can be made high, and hence light can be efficiently extracted through the translucent electrode 7.

Thus, the pitch dimension Pb of the protrusion 2b in the central region of the substrate 2 can be set to 2 µm or less.

Furthermore, according to the findings obtained by the inventors, if the angle A of the side surface of the protrusion 2a in the peripheral region of the substrate 2 is set to 60° or less, the number of components bent by diffraction can be increased, and hence light can be efficiently extracted from the peripheral side of the substrate 2.

Thus, the angle θ of the side surface of the protrusion 2a in the peripheral region of the substrate 2 can be set to 60° or less.

In this configuration, as shown in FIG. 1, light L1 is more likely to be reflected in the central region of the substrate 2. Hence, injection of the light L1 into the substrate 2 can be suppressed, and the reflected light L1 can be emitted outside through the semiconductor layer 3, the light emitting layer 4, the semiconductor layer 5, the light transmitting layer 6, and the translucent electrode 7. This can reduce the amount of attenuation of light in the substrate described above. Hence, the light extraction efficiency can be increased.

Furthermore, light L2 is more likely to be transmitted in the peripheral region of the substrate 2. Hence, reflection of the light L2 can be suppressed, and the transmitted light L2 can be emitted outside from the substrate 2. Thus, the light extraction efficiency can be increased.

Light L3 emitted from the light emitting layer 4 to the semiconductor layer 5 side is emitted outside through the semiconductor layer 5, the light transmitting layer 6, and the translucent electrode 7.

Here, as shown in FIG. 1, the thickness dimension of the substrate 2 is denoted by T, and the width dimension of the peripheral region is denoted by W. Then, the width dimension QW of the peripheral region is preferably made equal to or less than the thickness dimension T of the substrate 2. In this configuration, in the peripheral region of the substrate 2, the light L2 is easily emitted to the outside of the substrate 2 without injection into the major surface of the substrate 2 opposite to the semiconductor layer 3 side. This can reduce the amount of attenuation of light in the substrate described above. Hence, the light extraction efficiency can be increased.

In the foregoing example, at least one of the pitch dimension P, height dimension H, and protrusion side surface angle θ of the protrusion is changed depending on the two regions (central region and peripheral region). However, the number of regions may be three or more. Even in the case where the number of regions is three or more, an appropriate transmittance or reflectance of light can be provided to each region by changing at least one of the pitch dimension P, height dimension H, and protrusion side surface angle θ of the protrusion for each region.

Furthermore, at least one of the pitch dimension P, height dimension H, and protrusion side surface angle θ of the protrusion may be gradually changed.

In FIGS. 7A and 7B, protrusions 2a and protrusions 2b arranged in a matrix pattern are illustrated. However, the protrusions are not limited thereto.

Figure 8A:
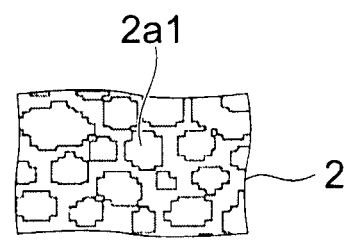
FIGS. 8A and 8B are schematic plan views for illustrating protrusions according to an alternative embodiment.
Figure 8B:
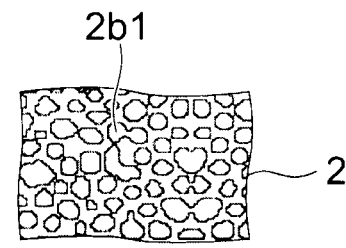

FIGS. 8A and 8B are schematic plan views for illustrating protrusions 2a1, 2b1 according to an alternative embodiment. More specifically, FIG. 8A is a schematic plan view illustrating the peripheral region of the substrate 2 in FIG. 1. FIG. 8B is a schematic plan view illustrating the central region of the substrate 2 in FIG. 1.

As shown in FIGS. 8A and 8B, the arrangement pattern of protrusions is not limited to a matrix pattern, but the protrusions can be arranged in an arbitrary pattern. Furthermore, the cross-sectional dimension, cross-sectional shape, and pitch dimension of the protrusion 2a1 and the protrusion 2b1 may not be constant.

In this case, the average of the pitch dimension of the protrusions 2a1 (hereinafter referred to as average pitch dimension) is denoted by Pa1, and the average of the pitch dimension of the protrusions 2b1 (hereinafter referred to as average pitch dimension) is denoted by Pb1. Then, it is only necessary that the relationship between the average pitch dimension Pa1 and the average pitch dimension Pb1 be identical to the relationship between the pitch dimension Pa and the pitch dimension Pb described above.

For instance, it is only necessary that the average pitch dimension Pb1 of the protrusions 2b1 in the central region of the substrate 2 be smaller than the average pitch dimension Pa1 of the protrusions 2a1 in the peripheral region of the substrate 2. In this case, the average pitch dimension Pa1 of the protrusions 2a1 in the peripheral region of the substrate 2 can be set to exceed 2 μm and to be 6 μm or less. Furthermore, the average pitch dimension Pb1 of the protrusions 2b1 in the central region of the substrate 2 can be set to 2 μm or less.

In the case where the pitch dimension is made constant, the "pitch dimension" is equal to the "average pitch dimension". Thus, in the specification, the "average pitch dimension" includes the aforementioned "pitch dimension".

Next, the transmitting portion 7a provided in the translucent electrode 7 is further illustrated.

Figure 9A:
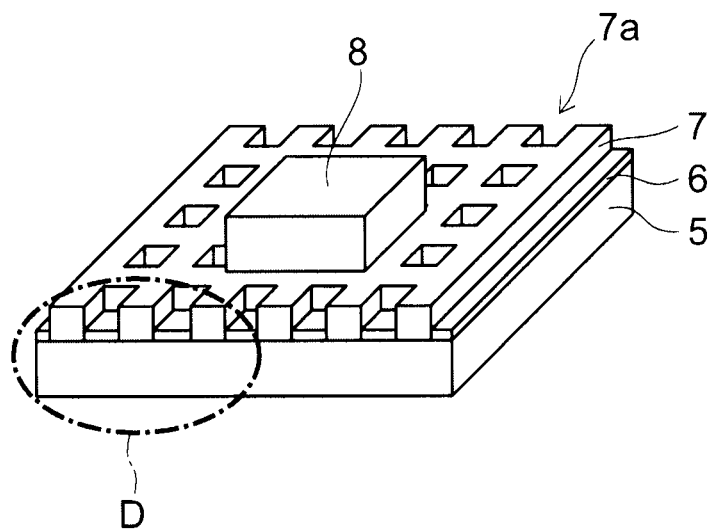
FIGS. 9A and 9B are schematic views for illustrating the transmitting portion.
Figure 9B:
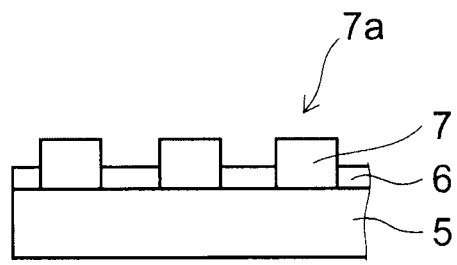

FIGS. 9A and 9B are schematic views for illustrating the transmitting portion 7a. More specifically, FIG. 9A is a schematic perspective view, and FIG. 9B is a schematic enlarged view of the portion D in FIG. 9A.

As described above, the light L3 emitted from the light emitting layer 4 to the semiconductor layer 5 side and the light L1 reflected by the substrate 2 are emitted outside through the translucent electrode 7. Thus, the translucent electrode 7 is formed form a light transmissive material such as ITO (indium tin oxide).

However, even if the translucent electrode 7 is formed from a light transmissive material, light is absorbed in passing through the translucent electrode 7. This decreases the light extraction efficiency.

Thus, in the embodiment, the translucent electrode 7 is provided with a transmitting portion 7a which is more transmissive to light. Thus, absorption of light is suppressed to increase the light extraction efficiency.

For instance, as shown in FIGS. 9A and 9B, transmitting portions 7a penetrating through the translucent electrode 7 can be provided in a matrix pattern. By providing a transmitting portion 7a penetrating through the translucent electrode 7, absorption of light transmitted through the transmitting portion 7a can be made extremely small. Hence, by that amount, the light extraction efficiency can be increased.

Figure 10A:
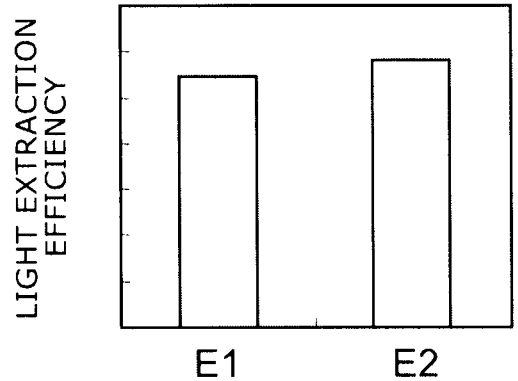
FIGS. 10A and 10B are schematic graphs for illustrating the effect of providing the transmitting portion.
Figure 10B:
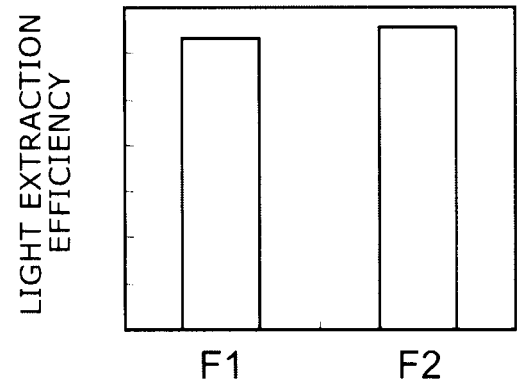

FIGS. 10A and 10B are schematic graphs for illustrating the effect of providing the transmitting portion.

More specifically, FIG. 10A shows the case where the light transmitting layer 6 having a thickness of 350 nm is formed from $SiO_2$ (silicon dioxide), and the translucent electrode 7 having a thickness of 170 nm is formed from ITO (indium tin oxide).

FIG. 10B shows the case where the light transmitting layer 6 having a thickness of 350 nm is formed from $SiO_2$ (silicon dioxide), and the translucent electrode 7 having a thickness of 70 nm is formed from ITO (indium tin oxide).

Furthermore, "E1" of FIG. 10A and "F1" of FIG. 10B represent the case where no transmitting portion 7a is provided. "E2" of FIG. 10A and "F2" of FIG. 10B represent the case where transmitting portions 7a penetrating through the translucent electrode 7 are provided in a matrix pattern, with the opening ratio set to 27%.

In FIG. 10A, comparing between "E1" and "E2", it is found that the light extraction efficiency can be increased by approximately 6%.

In FIG. 10B, comparing between "F1" and "F2", it is found that the light extraction efficiency can be increased by approximately 3%.

Furthermore, it is found that the light extraction efficiency can be increased more effectively by providing a transmitting portion 7a in the translucent electrode 7 having a large thickness, in which absorption of light is high.

In the foregoing, the transmitting portion 7a penetrating through the translucent electrode 7 is illustrated. However, the transmitting portion may be shaped like a recess not penetrating through the translucent electrode 7. For instance, the transmitting portion may be shaped like a bottomed hole or groove. Although a recess-shaped transmitting portion increases absorption of light transmitted through the transmitting portion, the characteristics as an electrode (such as forward drop voltage Vf and current spreading) can be improved. Hence, a recess-shaped transmitting portion may be provided to facilitate the flow of current in the region including the translucent electrode 7.

In the foregoing, the translucent electrode 7 including transmitting portions 7a arranged in a matrix pattern is illustrated. However, the shape of the translucent electrode can be suitably modified.

FIGS. 11A to 11E are schematic plan views for illustrating translucent electrodes according to alternative embodiments.

Figure 11A:
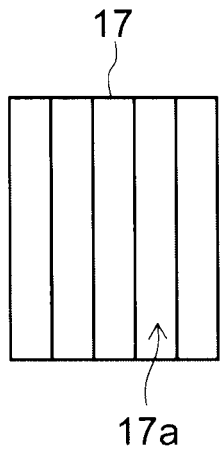
FIGS. 11A to 11E are schematic plan views for illustrating translucent electrodes according to alternative embodiments.
Figure 11B:
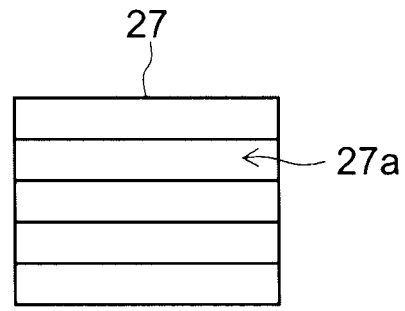
Figure 11C:
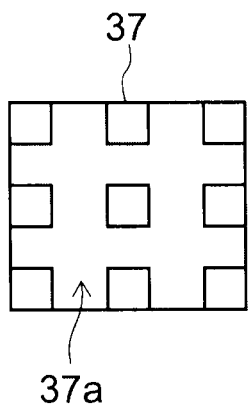
Figure 11D:
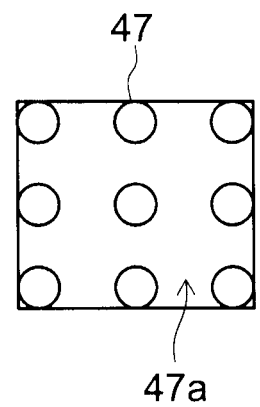
Figure 11E:
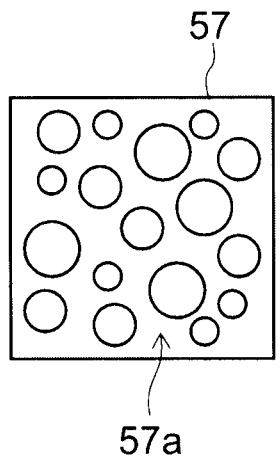

More specifically, FIG. 11A is a schematic plan view of a translucent electrode 17 including transmitting portions 17a shaped like vertical grooves. FIG. 11B is a schematic plan view of a translucent electrode 27 including transmitting portions 27a shaped like horizontal grooves. FIG. 11C is a schematic plan view of a translucent electrode 37 including a transmitting portion 37a shaped like a groove provided around quadrangular prisms. FIG. 11D is a schematic plan view of a translucent electrode 47 including a transmitting portion 47a shaped like a groove provided around circular cylinders. FIG. 11E is a schematic plan view of a translucent electrode 57 including a transmitting portion 57a shaped like a groove provided around circular cylinders with different sizes.

Thus, the translucent electrode can include a transmitting portion with an arbitrary planar shape.

Furthermore, the size, arrangement pitch dimension, number, opening ratio and the like of the transmitting portions can be suitably determined in consideration of the characteristics as an electrode (such as forward drop voltage Vf and current spreading).

Next, a method for manufacturing a semiconductor light emitting device according to the embodiment is illustrated.

The method for manufacturing a semiconductor light emitting device according to the embodiment can include e.g. forming, at a major surface (first major surface) of a substrate on the semiconductor layer 3 side, a peripheral region (first region) along the periphery of the major surface and a central region (second region) on the center side of the major surface as viewed from the peripheral region, the central region having a higher reflectance than the peripheral region; forming a semiconductor layer 3 (first semiconductor layer) on the major surface of the substrate; forming a light emitting layer 4 on the semiconductor layer 3; and forming a semiconductor layer 5 (second semiconductor layer) on the light emitting layer 4.

Alternatively, the method can include the step of forming, at a major surface (first major surface) of a substrate on the semiconductor layer 3 side, a peripheral region along the periphery of the major surface and a central region on the center side of the major surface as viewed from the peripheral region, the central region having a lower transmittance than the peripheral region; the step of forming a semiconductor layer 3 on the major surface of the substrate; the step of forming a light emitting layer 4 on the semiconductor layer 3;

and the step of forming a semiconductor layer 5 on the light emitting layer 4. That is, the transmittance in the peripheral region can be made higher than the transmittance in the central region.

Here, the reflectance and transmittance in the peripheral region and central region can be controlled by e.g. the protrusions 2a and protrusions 2b formed at the major surface of the substrate on the semiconductor layer 3 side.

More specifically, the transmittance or reflectance of light can be changed by changing e.g. the pitch dimension, height dimension, and protrusion side surface angle of the protrusion.

Thus, protrusions can be formed in each of the peripheral region and central region so that the reflectance in the peripheral region and central region, or the transmittance in the peripheral region and central region satisfies the aforementioned relationship.

Here, the pitch dimension, height dimension, protrusion side surface angle and the like of the protrusion are similar to those described above, and hence the detailed description thereof is omitted.

Such protrusions can be formed by using e.g. the nanoimprint method or lithography method.

The semiconductor layer 3, the light emitting layer 4, and the semiconductor layer 5 can be formed using known film formation methods, such as the metal organic chemical vapor deposition (MOCVD) method, molecular beam epitaxy (MBE) method, halide vapor phase epitaxy (HVPE) method, sputtering method, and ion plating method.

In addition, the light transmitting layer 6, the translucent electrode 7, the electrode 8, the electrode 9, the insulating layer 10 and the like provided in the semiconductor light emitting device 1 described above can be suitably formed. Here, these can be formed by known film formation methods and lithography methods, and hence the description thereof is omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a substrate including a first region provided along a periphery of a first major surface and a second region provided on a center portion of the first major surface;
a first semiconductor layer provided on the first major surface of the substrate;
a light emitting layer provided on the first semiconductor layer;
a second semiconductor layer provided on the light emitting layer; and
a translucent electrode provided on the second semiconductor layer, a reflectance in the second region being higher than a reflectance in the first region,
wherein
a plurality of protrusions are provided at the first major surface,
at least one selected from the group consisting of average pitch dimension, height dimension, and side surface angle of the protrusions is different between the first region and the second region so that the reflectance in the second region is made higher than the reflectance in the first region,
the average pitch dimension of the protrusions in the first region exceeds 2 μm and is 6 μm or less, and
the average pitch dimension of the protrusions in the second region is 2 μm or less.

2. The device according to claim 1, wherein the height dimension of the protrusions in the second region is smaller than the height dimension of the protrusions in the first region.

3. The device according to claim 1, wherein the side surface angle of the protrusions in the second region is larger than the side surface angle of the protrusions in the first region.

4. The device according to claim 1, wherein the side surface angle of the protrusions in the first region is 60° or less.

5. The device according to claim 1, wherein a width dimension of the first region is equal to or less than a thickness dimension of the substrate.

6. The device according to claim 1, wherein the translucent electrode includes a transmitting portion shaped like a recess.

7. The device according to claim 1, wherein the translucent electrode includes a transmitting portion penetrating through the translucent electrode.

8. A semiconductor light emitting device comprising:
a substrate including a first region provided along a periphery of a first major surface and a second region provided on a center portion of the first major surface;
a first semiconductor layer provided on the first major surface of the substrate;
a light emitting layer provided on the first semiconductor layer;
a second semiconductor layer provided on the light emitting layer; and
a translucent electrode provided on the second semiconductor layer,
a transmittance in the first region being higher than a transmittance in the second region,
wherein
a plurality of protrusions are provided at the first major surface,
at least one selected from the group consisting of average pitch dimension, height dimension, and side surface angle of the protrusions is different between the first region and the second region so that the transmittance in the first region is made higher than the transmittance in the second region,
the average pitch dimension of the protrusions in the first region exceeds 2 μm and is 6 μm or less, and
the average pitch dimension of the protrusions in the second region is 2 μm or less.

9. The device according to claim 8, wherein the height dimension of the protrusions in the second region is smaller than the height dimension of the protrusions in the first region.

10. The device according to claim 8, wherein the side surface angle of the protrusions in the second region is larger than the side surface angle of the protrusions in the first region.

11. The device according to claim 8, wherein a width dimension of the first region is equal to or less than a thickness dimension of the substrate.

12. The device according to claim 8, wherein the translucent electrode includes a transmitting portion shaped like a recess.

13. The device according to claim 8, wherein the translucent electrode includes a transmitting portion penetrating through the translucent electrode.

\* \* \* \* \*